(12) United States Patent
Legat et al.

(10) Patent No.: US 7,723,232 B2
(45) Date of Patent: May 25, 2010

(54) FULL BACKSIDE ETCHING FOR PRESSURE SENSING SILICON

(75) Inventors: Timothy John Legat, McKinney, TX (US); Alexander Noam Teutsch, Murphy, TX (US); Ross Elliot Teggatz, McKinney, TX (US); Thomas Richard Maher, Rehoboth, MA (US)

(73) Assignee: Texas Instruments Incorporated, Dallas, TX (US)

( * ) Notice: Subject to any disclaimer, the term of this patent is extended or adjusted under 35 U.S.C. 154(b) by 1364 days.

(21) Appl. No.: 11/171,939

(22) Filed: Jun. 30, 2005

(65) Prior Publication Data
US 2007/0004207 A1 Jan. 4, 2007

(51) Int. Cl.
*H01L 21/302* (2006.01)
(52) U.S. Cl. ...................................... 438/689
(58) Field of Classification Search ................ 438/689, 438/706, 710, 723, 745, 753
See application file for complete search history.

(56) References Cited

U.S. PATENT DOCUMENTS

| | | | |
|---|---|---|---|
| 4,766,655 A | 8/1988 | Hickox | |
| 5,184,515 A | 2/1993 | Terry et al. | |
| 5,600,074 A | 2/1997 | Marek et al. | |
| 5,856,765 A * | 1/1999 | Hermann | ............... 331/108 C |
| 5,983,727 A | 11/1999 | Wellman et al. | |
| 6,210,989 B1 | 4/2001 | Kurtz et al. | |
| 6,232,139 B1 * | 5/2001 | Casalnuovo et al. | ........... 438/48 |
| 6,401,542 B1 | 6/2002 | Kato | |
| 2002/0117937 A1* | 8/2002 | Sakata et al. | ................ 310/311 |
| 2003/0148610 A1* | 8/2003 | Igel et al. | .................... 438/689 |
| 2005/0104939 A1* | 5/2005 | Wada et al. | ................... 347/68 |

* cited by examiner

*Primary Examiner*—Allan Olsen
(74) *Attorney, Agent, or Firm*—Warren L. Franz; Wade J. Brady, III; Frederick J. Telecky, Jr.

(57) ABSTRACT

The formation of a semiconductor sensing device is disclosed, where the device can be used to sense pressure, for example. The device is formed by etching the entire backside of a semiconductor substrate or wafer. This streamlines the fabrication process by omitting a number of steps that would otherwise be required to selectively etch certain locations of the substrate. This also improves device performance and compactness by allowing associated support circuitry to be formed closer to a sensing region, and more particularly piezoelectric elements of the sensing region.

10 Claims, 3 Drawing Sheets

FULL BACKSIDE ETCHING FOR PRESSURE SENSING SILICON

FIELD OF INVENTION

The present invention relates generally to semiconductor fabrication, and more particularly to forming a semiconductor sensing device.

BACKGROUND OF THE INVENTION

It can be appreciated that some semiconductor devices comprise elements or features that actually deflect or otherwise move or deform in the operation of the devices. For example, some types of sensors, such as pressure sensors and/or accelerometers/decelerometers, for example, include a portion of a semiconductor substrate (e.g., silicon) that moves in response to changes in pressure and/or acceleration or deceleration, for example. Such devices can be used in automotive applications, for example, to determine the severity of a side impact collision as well as whether an individual is present in a passenger seat of the automobile, and thus whether both a driver side and a passenger side airbag should be deployed, for example. Similarly, such sensors could be used to determine the pressure within different systems of an automobile, such as within the engine, for example, and thus whether a 'check engine' light should be activated or illuminated.

Such devices generally comprise one or more piezoelectric elements whose electrical characteristics change as a function of an encountered force, (e.g., amount of deflection). The devices may employ piezoresistance, for example, such that a resistance changes as a function of deflection (e.g., due to a change in pressure). Such piezoresistive elements can be formed, for example, through diffusion or doping processes whereby the resistance of these treated areas changes as a function of applied stress. It is not uncommon for such devices to be arranged in a Wheatstone bridge configuration to provide an enhanced output signal. In any event, sensing regions generally require associated circuitry, such as support circuitry for calibration and/or compensation, among other things, for example. Signals produced by the piezoresistive elements can, for example, be sensed by conductive traces and then processed by associated circuitry and forwarded via leads to external circuitry, which can, for example, use the sensed signals to determine whether to deploy an airbag.

It can also be appreciated that there is an ongoing desire to decrease the size of semiconductor devices while concurrently reducing the cost of such devices, such as through streamlining an associated fabrication process, for example. Nevertheless, sensing regions are conventionally formed in silicon by selectively etching the backside of certain areas of a substrate so that the thickness of the substrate in these areas is sufficiently reduced so that the silicon deflects or deforms in response to an applied stress. This selective etching process, however, requires multiple steps that protract the fabrication process. Moreover, the small selectively thinned areas prohibit associated circuitry from being formed close to the sensing regions, where forming associated circuitry close to sensing regions would be desirable because it fosters enhanced performance and allows sensing devices to be more compact.

By way of further example discrete piezoresistive sensing resistors (e.g., metal foil, silicon resistors in a wheatstone bridge configuration) that are bonded to an engineered mechanical structure, and that have separate signal conditioning electronics mounted in a stress free zone (e.g., ASIC mounted on a separate PCB) can be used for force sensors where the strain gages are mounted on a load cell/beam, or for a pressure sensor where the strain gages are mounted on a metal diaphragm. This configuration has certain disadvantages in terms of packaging size, packaging complexity, and/or cost due to the use of separate strain gage resistors and signal conditioning ASIC. This arrangement does have an advantage, however, of the piezoresistive sensing resistors not coming into contact with the pressure media being sensed; that is, the sensing resistors are sensing the stress transmitted through a diaphragm that is in direct contact with the pressure media.

By way of further example, in piezoresistive sensing resistors that are integrated with signal conditioning electronics on a selectively thinned single silicon substrate, the applied strain can be isolated from the signal conditioning circuitry. In this arrangement the thinned silicon section forms a diaphragm that is in direct contact with the pressure media being sensed. While the integrated strain gage and signal conditioning structure provides desirable packaging size and cost advantages, this type of integrated structure may have applications limited to pressure sensing due to the fact that the design must allow the pressure media to be in direct contact with the silicon.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention pertain to forming a semiconductor sensing device by etching the entire backside of a semiconductor substrate, rather than selectively etching certain areas of a wafer. Etching the entire substrate streamlines the fabrication process by reducing the number of steps involved, and it also promotes improved performance and a more compact sensing device as it enables associated support circuitry to be formed closer to a sensing region.

An integrated strain gage and signal conditioning design that overcomes limitations of traditional sensor designs is generated in accordance with one or more aspects of the present invention. More particularly, an integrated strain gage and signal conditioning structure provides sensor cost and size benefits, and can be used in a wide range of sensors, including both load cells and media isolated pressure sensors. Notably, associated support circuitry (e.g., signal conditioning ASIC) and piezoresistive sensing resistors are integrated onto a uniformly (not selectively) thinned die. The approach allows a flat backside surface to be produced on the wafer (die) so that a mechanical strain sensing structure can be formed therein, while concurrently mitigating structural stiffness so as to not interfere with mechanical sensing. This allows for the use of a strain insensitive signal conditioning architecture.

According to one or more aspects of the present invention, a method of forming a semiconductor sensing device is disclosed. The method includes chemically etching the entire backside of a semiconductor substrate so that the substrate flexes in response to an applied stress, and then forming the sensing device within the thinned substrate.

According to one or more further aspects of the present invention, a semiconductor wafer is disclosed. The wafer has a backside that has been chemically etched such that the wafer has a thickness of between about 6 mils and about 8 mils. One or more sensing devices are also formed within the thinned semiconductor wafer.

In accordance with yet one or more further aspects of the present invention, a semiconductor sensing device is disclosed. The sensing device includes a sensing region formed within a thinned semiconductor substrate and associated support circuitry also formed within the thinned semiconductor substrate in close proximity to the sensing region.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
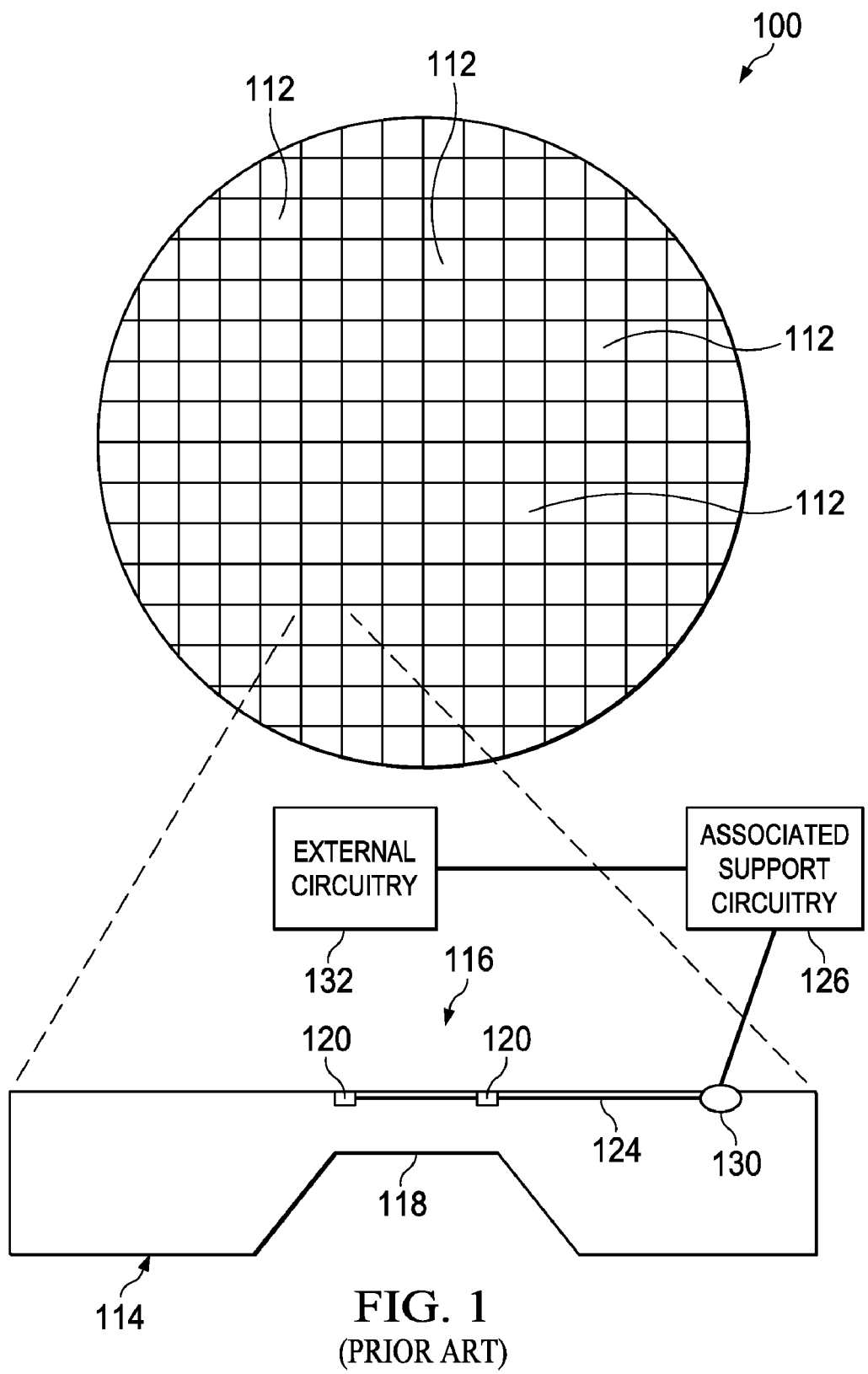
FIG. 1 is a schematic diagram illustrating a semiconductor wafer having a plurality of die thereon and a cross sectional illustration of an enlargement of a die having a conventional pressure sensor formed thereon.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

FIG. 1 is a schematic diagram illustrating a top view of a semiconductor wafer 100 having a plurality of die 112 thereon. Additionally, a cross sectional view presents an enlarged illustration of an exemplary die 114 of the wafer 100. The die 114 has a conventional pressure sensor 116 formed thereon. In particular, a selective etching process has been performed on the backside of the wafer 100 to remove a portion of the backside of the wafer at the wafer die 114. This selective etching process leaves a portion 118 of the die 114 relatively thin so that it flexes in response to an applied pressure. One or more piezoelectric elements 120 are formed in this thinned region 118 to generate an electrical signal in response to a flexing of the thinned region 118. This signal is delivered via an electrically conductive lead 124 to associated support circuitry 126, which can perform calibration and/or compensation functions, for example. In this conventional arrangement, however, the associated support circuitry 126 is not integral to the die 114. Rather, the die 114 is cut from the wafer 100 and then operatively associated with the support circuitry 126, such as by an electrode or solder bond 130, for example. In the illustrated example, the associated support circuitry 126 is further connected to external circuitry 132 which can use the detected signals for different purposes, such as to determine whether to deploy an airbag, for example.

It can be appreciated, however, that spot etching the back side of each die 112 on the wafer 100 in this conventional manner can be tedious, time consuming and expensive. In particular, the respective regions 118 of the die 114 are generally thinned using lithographic techniques, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example. In this case, the patterned mask would be formed over the backside of the wafer 100 with the exposed pattern allowing an etchant to etch away or remove material at the respective regions 118 on the different die 112. In addition to protracting the fabrication process, etching individual die may also (unintentionally) produce sensors that have different operating characteristics. More particularly, since the sensitivity of the sensors is primarily a function of the thickness of the wafer 100 at the thinned regions 118 (e.g., how readily the substrate deflects in response to applied pressure), the individually produced sensors can produce different results since the selective etching processes may thin the respective regions 118 differently. In this manner, different sensors 16 may give different readings in response to the same or a similar applied pressure.

Figure 2:
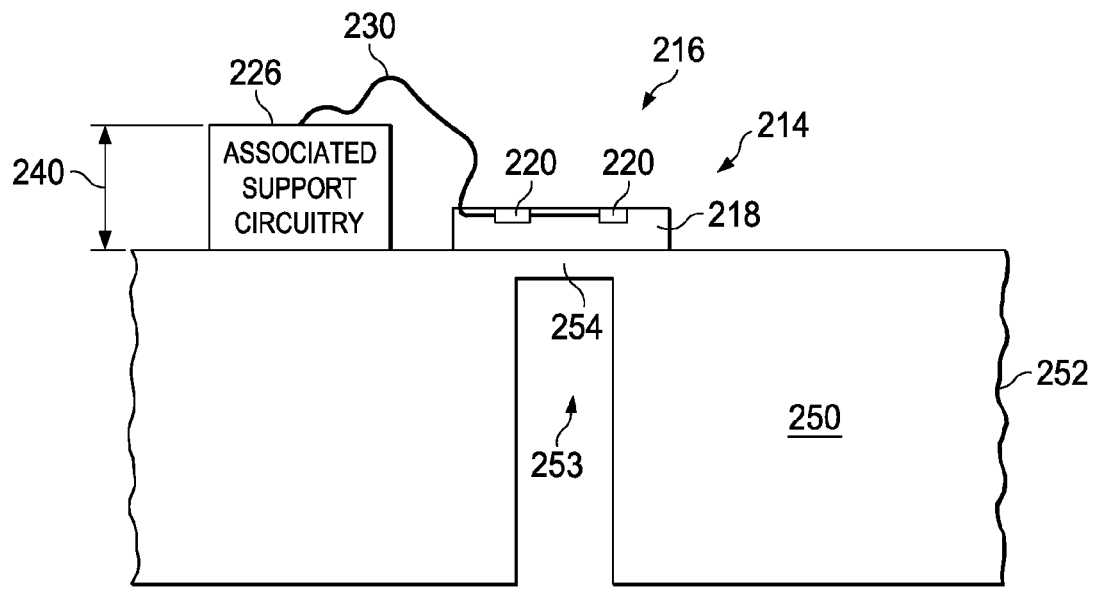
FIG. 2 is a cross sectional illustration of a conventional pressure sensor associated on a pressure sensor housing.

FIG. 2 is another cross sectional illustration of a conventional pressure sensor 216. The sensor 216 is seated atop a pressure sensor housing 250 that can be threaded 252 into a system where the pressure is to be sensed, such as within a combustion chamber of an internal combustion engine, for example. The housing 250 has an aperture 253 formed therein that allows a pressure that is to be sensed to be applied against the sensor 216 (e.g., via a mechanical diaphragm 254 of the housing 250). The sensor 216 is formed from a wafer die 214, the backside of which has been selectively etched to produce a thinned region 218. The sensor 200 also has multiple piezoelectric elements 220 formed therein. The elements 220 are operatively coupled to associated support circuitry 226 via one or more bond wires 230. In this conventional arrangement, the support circuitry 226 is again not integral with the wafer die 214. Rather, the support circuitry 226 is formed in the un-thinned 240 substrate. As such, the sensor 216 is not very compact and may not perform optimally as some signal degradation, as well as a time delay, may occur along the bond wire(s), for example.

Figure 3:
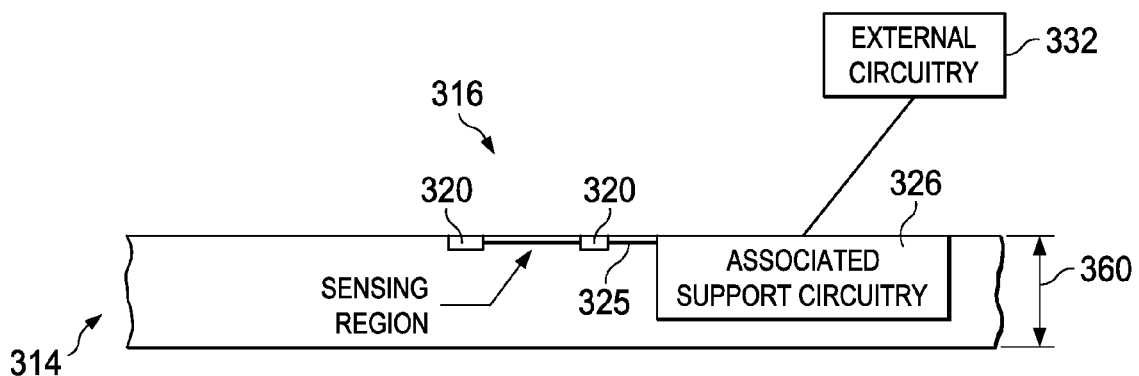
FIG. 3 is a cross sectional illustration of a semiconductor substrate having a semiconductor sensing device formed thereon in accordance with one or more aspects of the present invention.

FIG. 3 is a cross sectional view illustrating a semiconductor sensing device formed according to one or more aspects of the present invention. More particularly, FIG. 3 depicts a semiconductor wafer die 314 that has been cut (e.g., via a metal cutting blade or other mechanical means) from a uniformly thinned semiconductor wafer or substrate, and that has a semiconductor sensing device 316 formed therein. It will be appreciated that for purposes of the present invention, the wafer and/or die 314 can include a semiconductor substrate, an epitaxial layer deposited or otherwise formed on a semiconductor substrate and/or any other type of semiconductor body (e.g., silicon, SiGe, SOI).

In forming the device 316 according to one or more aspects of the present invention, the entire backside of the wafer from which the die 314 is cut is initially thinned to a thickness 360 of between about 6 mils and about 8 mils, for example. The device 316 includes a sensing region 360 wherein one or more piezoelectric elements 320 are formed, such as via doping and/or diffusion, for example. In addition, associated support circuitry 326 (e.g., ASIC/signal conditioning circuitry) is also formed within the thinned wafer die 314. The associated support circuitry 326 is operatively coupled to the diffusion regions 360, and more particularly to the piezoelectric elements 320, via a conductive trace 325 that is also formed within the die 314. The associated support circuitry 326 is in turn coupled to external circuitry 332. It can be appreciated that having the associated support circuitry 326 in close proximity to the sensing region 360 improves performance (e.g., due to improved eletro-mechanical connections, and a lack of signal degradation and/or timing delay(s)). It will be appreciated that the application of a controlled chemical back etch process according to one or more aspects of the present invention yields a thinner wafer and a higher quality of uniform thickness as well as smoothness and structural integrity unattainable in mechanical back grinding processes. These chemical back etch attributes allow for integration of the piezo-electric element and the support circuitry to be placed on the same substrate. More particularly, the treated substrate is thin enough to allow flexibility for the piezo-electrics and structurally sound enough to contain the support circuitry. In addition to allowing semiconductor sensors to be made smaller or more compact, integrating the support circuitry 326 also reduces fabrication costs by obviating the need for additional components, such as bond wires and/or solder. Eliminating such components which are susceptible to failure (e.g., bond wire breaking and/or solder joint detaching) also enhances the resilience of such devices 316.

It will be appreciated that the backside of the wafer is uniformly thinned to such a degree that the die 314 deflects or deforms in response to a force applied thereto (e.g., due to pressure, acceleration, deceleration, etc.). Additionally, the piezoelectric elements 320 are generally formed at the outskirts or edges of the portion of the die 314 that deflects (e.g., the sensing region 360) so that they experience a maximum flexing and thus afford the sensing device 316 with an enhanced or optimum sensitivity.

According to one or more aspects of the present invention, the wafer, and thus the die 314, can be thinned by a wet etching process. Uniformly etching the entire backside of the wafer has several advantages over conventional ways of reducing its thickness, such as mechanical back grinding, for example. Nevertheless, some preliminary mechanical back grinding may (optionally) be performed according to one or more aspects of the present invention to partially thin the wafer. For example, a wafer having a thickness of about 30 mils can be preliminarily thinned to about 20 mils by back grinding. Chemical etching, however, can be controlled to much tighter tolerances than grinding alone, both in overall resultant thickness and in variation of thickness across the entire wafer. This allows more consistent sensors to be fabricated from a more uniformly thinned wafer, and wafer die. Substantial back grinding can also induce stress fractures in the semiconductor substrate, which can degrade the performance of resulting semiconductor devices. Etched wafer die have also shown improved adhesion characteristics (e.g., for subsequently applied layer(s), element(s), etc.). Finally, etching the entire wafer streamlines the fabrication process by eliminating several steps that would otherwise be needed to spot etch the wafer die 314.

Figures 4, 5:
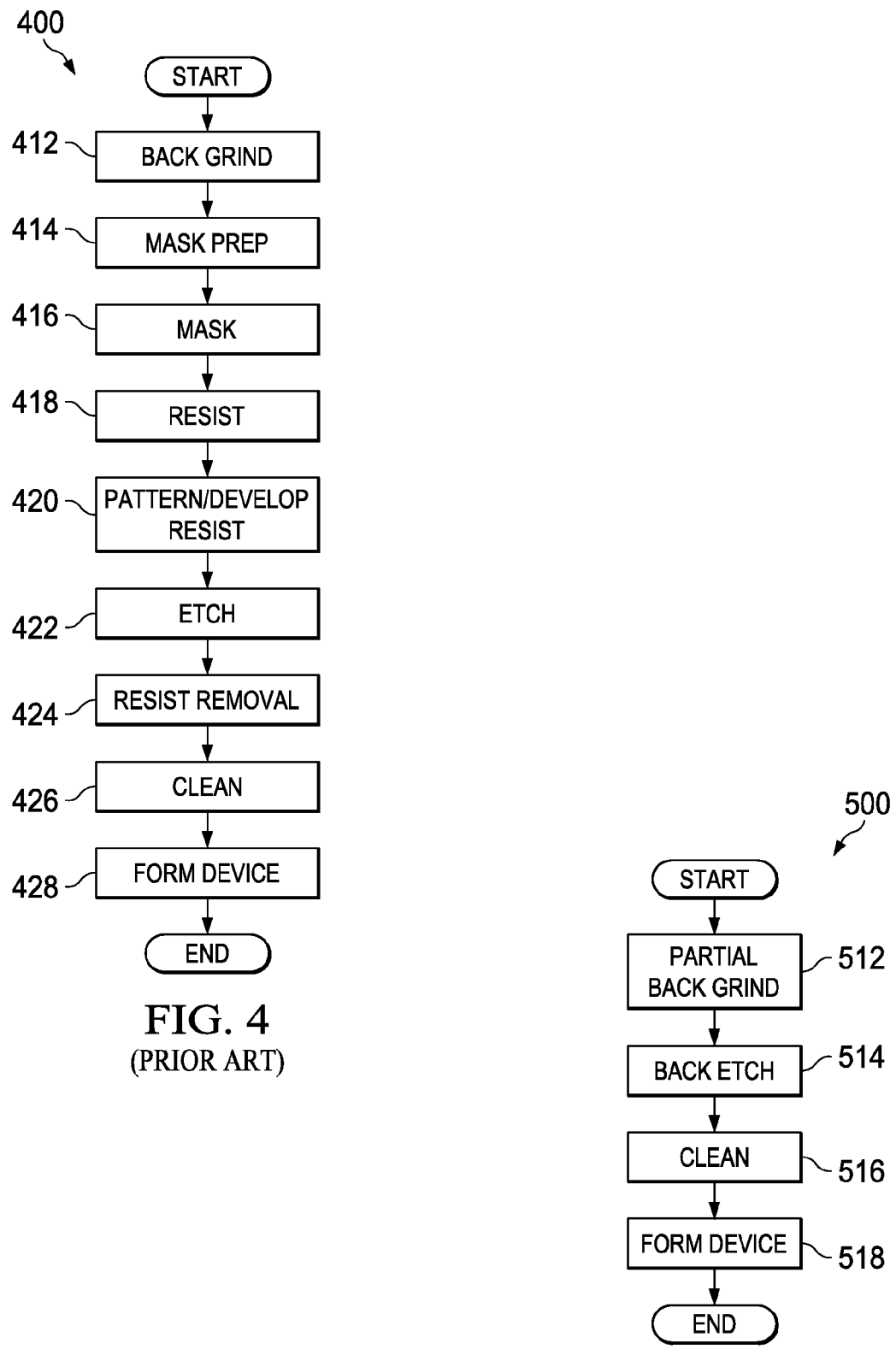
FIG. 4 is a flow diagram illustrating a conventional methodology for forming a semiconductor sensing device.
FIG. 5 is a flow diagram illustrating an exemplary methodology for forming a semiconductor sensing device according to one or more aspects of the present invention.

Turning to FIG. 4, for example, a methodology 400 is illustrated for spot etching a wafer in a conventional manner. Initially, the backside of the wafer is ground down by mechanical means at 412. A mask prep step is then performed at 414 wherein the back side of the wafer is cleaned (e.g., washed and dried). Then, at 416 a masking step is performed wherein an intervening mask is positioned between a radiation source and the backside of the wafer—where the mask itself has to be fashioned beforehand to correspond to a pattern to be transferred onto the wafer. A layer of radiation sensitive masking material (e.g., a resist) is then formed over the back side of the wafer at 418. The layer of masking material is then patterned and developed at 420 by shining radiation thereon that selectively passes through the intervening mask or template and then applying a developer (e.g., an acid wash) that removes the portions of the masking material made soluble by the selective radiation exposure. Portions of the backside of the wafer are then removed via an etching process at 422, where the patterned layer of masking material serves as a mask for the etching process. The patterned layer of masking material is then stripped or otherwise removed (e.g., via an acid wash) at 424. The backside of the wafer is then subjected to a final cleanup step at 426 before a semiconductor sensor can be formed on a wafer die at 428.

An exemplary methodology 500 of forming a semiconductor sensor on a wafer die according to one or more aspects of the present invention is on the other hand illustrated in the flow diagram of FIG. 5. It will be appreciated that although the methodology 500 is illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

The methodology 500 begins at 512 wherein an optional back grinding of the backside of a wafer is performed to reduce the thickness of the wafer to about 20 mils. Then, at 514 the back side of the wafer is uniformly etched with a wet etch chemistry so that the wafer is reduced to thickness of between about 6 mils and about 8 mils, for example. The thinned wafer is then cleaned at 516 and a semiconductor sensor is formed on a wafer die at 518. It will be appreciated that the die can be removed from the wafer in any suitable manner, such as by being cut with traditional mechanical means so as to not complicate the fabrication process.

It can thus be appreciated that forming a semiconductor sensor as described herein where the back side of a wafer is initially etched to a reduced uniform thickness streamlines the fabrication process, thereby reducing costs associated with producing the sensor. Additionally, sensors produced in manners described herein have improved reliability and can be made more compact as compared to conventionally produced sensors. Less expensive sensors can translate to into huge savings since many sensors can be used in the automotive industry alone. For example, (conservatively) assume that there are 50 million vehicles (e.g., cars, trucks, busses, etc.) wherein such sensors can be used, and that each vehicle can include 1 sensor in its chassis, 5 occupant (weight) sensors and 5 engine (pressure) sensors. This would put sensor demand at 550 million sensors—50 million for the chassis, 250 million for occupants and 250 million for the engine. Even more conservatively assuming a 50% participation for the chassis, a 20% participation for the occupants and a 20% participation for the engine, there still remains a demand for 125 million sensors (annually)—25 million for the chassis, 50 million for the occupants and 50 million for the engine. It can be appreciated that saving just a little per sensor can lead to extraordinary overall savings.

It is to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the term "exemplary" as used herein merely meant to mean an example, rather than the best. Further, although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a semiconductor sensing device, comprising:
    chemically etching the entire backside of a semiconductor substrate so that the substrate flexes, when supported, in response to an applied stress;
    forming one or more piezoelectric elements within a sensing region of the thinned substrate;
    forming associated support circuitry within the thinned substrate in close proximity to the sensing region; and
    operatively associating the support circuitry with the sensing region without the use of a bond wire.

2. The method of claim 1, wherein the thinned substrate has a thickness of between about 6 mils and about 8 mils.

3. The method of claim 1, wherein the semiconductor substrate is a wafer having a die area; the chemically etching etches the entire backside of the wafer; the one or more piezoelectric elements are formed within the sensing region in the die area; the associated support circuitry is formed in the die area outside the sensing region; and the operatively associating comprises forming conductive traces coupling the associated support circuitry with the one or more piezoelectric elements; and further comprising:
    removing the die area from a rest of the wafer, whereby the semiconductor sensing device comprises a die including the sensing region with the piezoelectric elements, the associated support circuitry outside the sensing region, and the conductive traces.

4. The method of claim 1, wherein the backside of the substrate is etched with a wet etch chemistry.

5. The method of claim 4, wherein the one or more piezoelectric elements are piezoresistive elements arranged in Wheatstone bridge configuration.

6. The method of claim 1, wherein the sensing device is a pressure sensor.

7. The method of claim 6, further comprising mounting the sensing device within a pressure sensing housing.

8. The method of claim 7, further comprising threading the pressure sensing housing into a system wherein the pressure is to be sensed.

9. A method of forming a semiconductor pressure sensing device, comprising:
    chemically etching an entire backside of a semiconductor wafer to thin the wafer to a uniform thickness of between about 6 mils and about 8 mils; the wafer including one or more die areas each die area having a sensing region therein;
    forming piezoresistive elements in the form of silicon resistors formed via doping and diffusion in Wheatstone bridge configuration in the sensing region of each die area of the thinned wafer;
    forming support circuitry outside the sensing region within each die area of the thinned wafer;
    forming conductive traces within each die area, to conductively couple the support circuitry to the piezoresistive elements in each die area;
    cutting the one or more die areas, each with the piezoresistive elements, the support circuitry and the conductive traces, from the thinned wafer;
    thereby providing one or more dies with integral support circuitry suitable to serve as deformable diaphragms for seating atop apertures of sensor housings; whereby deformation of the seated die in response to changes in pressure will cause changes in change resistance of the piezoresistive elements to produce corresponding signals sensed by the conductive traces and processed by the support circuitry.

10. In a method of forming a semiconductor sensing device, including selectively etching less than all of a backside of a semiconductor wafer to remove a sensing region portion in each of one or more die areas of wafer; forming discrete piezoresistive sensing resistors in Wheatstone bridge configuration in each sensing region; cutting the one or more die areas including the piezoresistive sensing resistors from the wafer to form one or more dies which, when supported in a sensor housing and connected to external support circuitry, can flex in response to changes in applied pressure and produce signals corresponding to such changes in applied pressure; the improvement comprising:
    chemically etching an entire backside of the wafer to thin the wafer to a uniform thickness equal to the thickness of the removed sensing region portion;

forming the piezoresistive sensing resistors in the sensing region of each of the one or more die areas of the uniformly thinned wafer;

forming support circuitry outside of each sensing region within each of the one or more die areas of the thinned wafer;

forming conductive traces within each of the one or more die areas of the thinned wafer, to conductively couple the support circuitry to the piezoresistive elements in each die area;

cutting the one or more die areas, including the piezoresistive sensing resistors, the support circuitry and the conductive traces, from the thinned wafer to form one or more dies which include support circuitry integrally therewith and which, when supported in a sensor housing, can flex in response to changes in applied pressure and produce signal corresponding to such changes in applied pressure and process the produced signals by the support circuitry.

* * * * *